United States Patent
Ashtiani et al.

(10) Patent No.: US 8,062,977 B1
(45) Date of Patent: Nov. 22, 2011

(54) TERNARY TUNGSTEN-CONTAINING RESISTIVE THIN FILMS

(75) Inventors: Kaihan Ashtiani, Cupertino, CA (US); Raashina Humayun, Fremont, CA (US); Girish Dixit, San Jose, CA (US); Anna Battaglia, AciCastello (IT); Stefano Rassiga, Caltignaga (IT)

(73) Assignee: Novellus Systems, Inc., San Jose, CA (US)

( * ) Notice: Subject to any disclaimer, the term of this patent is extended or adjusted under 35 U.S.C. 154(b) by 406 days.

(21) Appl. No.: 12/363,330

(22) Filed: Jan. 30, 2009

Related U.S. Application Data

(60) Provisional application No. 61/025,237, filed on Jan. 31, 2008.

(51) Int. Cl.
H01L 21/44 (2006.01)
(52) U.S. Cl. ............... 438/681; 257/E21.168
(58) Field of Classification Search .......... 438/681; 257/E21.168
See application file for complete search history.

(56) References Cited

U.S. PATENT DOCUMENTS

| | | |
|---|---|---|
| 4,746,375 A | 5/1988 | Lacovangelo |
| 4,804,560 A | 2/1989 | Shioya et al. |
| 5,028,565 A | 7/1991 | Chang et al. |
| 5,227,329 A | 7/1993 | Kobayashi et al. |
| 5,250,329 A | 10/1993 | Miracky et al. |
| 5,326,723 A | 7/1994 | Petro et al. |
| 5,391,394 A | 2/1995 | Hansen |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |
| 5,817,576 A | 10/1998 | Tseng et al. |
| 5,926,720 A | 7/1999 | Zhao et al. |
| 5,956,609 A | 9/1999 | Lee et al. |
| 6,001,729 A | 12/1999 | Shinriki et al. |
| 6,017,818 A | 1/2000 | Lu |
| 6,037,263 A | 3/2000 | Chang |
| 6,066,366 A | 5/2000 | Berenbaum et al. |
| 6,099,904 A | 8/2000 | Mak et al. |
| 6,107,200 A | 8/2000 | Takagi et al. |
| 6,143,082 A | 11/2000 | McInerney et al. |
| 6,174,812 B1 | 1/2001 | Hsiung et al. |

(Continued)

FOREIGN PATENT DOCUMENTS

WO WO01/27347 4/2001

OTHER PUBLICATIONS

Chan et al., "Methods for Growing Low-Resistivity Tungsten Filml", Novellus Systems Inc., U.S. Appl. No. 12/538,770, filed Aug. 10, 2009.

(Continued)

Primary Examiner — Trung Q Dang
(74) Attorney, Agent, or Firm — Weaver Austin Villeneuve & Sampson LLP

(57) ABSTRACT

Heater elements made of high resistivity ternary and quaternary thin films containing three or more of W, C, O, N and Si are provided. The thin films have resistivities at least about 1000 μΩ-cm at 50 to 60 Angstroms. The ternary and quaternary films have improved stability over binary films on anneal. Methods of depositing the thin films are also provided. The methods involve depositing the film from an organometallic tungsten precursor under conditions such that a highly resistive, continuous film is formed.

12 Claims, 9 Drawing Sheets

U.S. PATENT DOCUMENTS

| | | | |
|---|---|---|---|
| 6,206,967 | B1 | 3/2001 | Mak et al. |
| 6,245,654 | B1 | 6/2001 | Shih et al. |
| 6,265,312 | B1 | 7/2001 | Sidhwa et al. |
| 6,277,744 | B1 | 8/2001 | Yuan et al. |
| 6,294,468 | B1 | 9/2001 | Gould-Choquette et al. |
| 6,297,152 | B1 | 10/2001 | Itoh et al. |
| 6,309,966 | B1 | 10/2001 | Govindarajan et al. |
| 6,355,558 | B1 | 3/2002 | Dixit et al. |
| 6,404,054 | B1 | 6/2002 | Oh et al. |
| 6,465,347 | B2 | 10/2002 | Ishizuka et al. |
| 6,551,929 | B1 | 4/2003 | Kori et al. |
| 6,566,250 | B1 | 5/2003 | Tu et al. |
| 6,566,262 | B1 | 5/2003 | Rissman et al. |
| 6,607,976 | B2 | 8/2003 | Chen et al. |
| 6,635,965 | B1 | 10/2003 | Lee et al. |
| 6,706,625 | B1 | 3/2004 | Sudijono et al. |
| 6,720,261 | B1 | 4/2004 | Anderson et al. |
| 6,740,585 | B2 | 5/2004 | Yoon et al. |
| 6,791,102 | B2 | 9/2004 | Johnson et al. |
| 6,797,340 | B2 | 9/2004 | Fang et al. |
| 6,844,258 | B1 | 1/2005 | Fair et al. |
| 6,861,356 | B2 | 3/2005 | Matsuse et al. |
| 6,902,763 | B1 | 6/2005 | Elers et al. |
| 6,905,543 | B1 | 6/2005 | Fair et al. |
| 6,908,848 | B2 | 6/2005 | Koo |
| 6,936,538 | B2 | 8/2005 | Byun |
| 6,939,804 | B2 | 9/2005 | Lai et al. |
| 6,962,873 | B1 | 11/2005 | Park |
| 7,005,372 | B2 | 2/2006 | Levy et al. |
| 7,141,494 | B2 | 11/2006 | Lee et al. |
| 7,157,798 | B1 | 1/2007 | Fair et al. |
| 7,196,351 | B2 | 3/2007 | Chiang et al. |
| 7,211,144 | B2 | 5/2007 | Lu et al. |
| 7,211,819 | B2 | 5/2007 | Karpov |
| 7,220,671 | B2 * | 5/2007 | Simka et al. .................. 438/680 |
| 7,262,125 | B2 | 8/2007 | Wongsenakhum et al. |
| 7,416,979 | B2 | 8/2008 | Yoon et al. |
| 7,429,402 | B2 | 9/2008 | Gandikota et al. |
| 7,589,017 | B2 | 9/2009 | Chan et al. |
| 7,655,567 | B1 | 2/2010 | Gao et al. |
| 7,691,749 | B2 | 4/2010 | Levy et al. |
| 7,754,604 | B2 | 7/2010 | Wongsenakhum et al. |
| 7,772,114 | B2 | 8/2010 | Chan et al. |
| 7,955,972 | B2 | 6/2011 | Chan et al. |
| 2001/0008808 | A1 | 7/2001 | Gonzalez |
| 2001/0014533 | A1 | 8/2001 | Sun |
| 2001/0015494 | A1 | 8/2001 | Ahn |
| 2001/0044041 | A1 | 11/2001 | Badding et al. |
| 2002/0090796 | A1 | 7/2002 | Desai et al. |
| 2002/0177316 | A1 | 11/2002 | Miller et al. |
| 2003/0059980 | A1 | 3/2003 | Chen et al. |
| 2003/0104126 | A1 | 6/2003 | Fang et al. |
| 2003/0127043 | A1 | 7/2003 | Lu et al. |
| 2004/0014315 | A1 | 1/2004 | Lai et al. |
| 2004/0044127 | A1 | 3/2004 | Okubo et al. |
| 2004/0142557 | A1 | 7/2004 | Levy et al. |
| 2004/0202786 | A1 | 10/2004 | Wongsenakhum et al. |
| 2004/0206267 | A1 | 10/2004 | Sambasivan et al. |
| 2005/0031786 | A1 | 2/2005 | Lee et al. |
| 2005/0059236 | A1 | 3/2005 | Nishida et al. |
| 2005/0136594 | A1 | 6/2005 | Kim |
| 2006/0094238 | A1 | 5/2006 | Levy et al. |
| 2007/0099420 | A1 * | 5/2007 | Dominguez et al. .......... 438/681 |
| 2007/0190780 | A1 | 8/2007 | Chung et al. |
| 2008/0081127 | A1 * | 4/2008 | Thompson et al. ........... 427/569 |
| 2008/0124926 | A1 | 5/2008 | Chan et al. |
| 2008/0254623 | A1 | 10/2008 | Chan et al. |
| 2008/0280438 | A1 | 11/2008 | Lai et al. |
| 2008/0285335 | A1 | 11/2008 | Elmegreen et al. |
| 2009/0149022 | A1 | 6/2009 | Chan et al. |
| 2009/0163025 | A1 | 6/2009 | Humayun et al. |
| 2010/0035427 | A1 | 2/2010 | Chan et al. |
| 2010/0055904 | A1 | 3/2010 | Chen et al. |
| 2010/0159694 | A1 | 6/2010 | Chandrashekar et al. |
| 2010/0267230 | A1 | 10/2010 | Chandrashekar et al. |
| 2010/0267235 | A1 | 10/2010 | Chen et al. |
| 2010/0273327 | A1 | 10/2010 | Chan et al. |

OTHER PUBLICATIONS

U.S. Final Office Action mailed Jan. 13, 2010 from U.S. Appl. No. 12/030,645.

Gao et al., "Method for Improving Adhesion of Low Resistivity Tungsten/Tungsten Nitride Layers," Novellus Systems, Inc., U.S. Appl. No. 12/556,490, filed Sep. 9, 2009.

Gao et al., "Methods for Improving Uniformity and Resistivity of Thin Tungsten Films," Novellus Systems, Inc., filed Dec. 11, 2009, U.S. Appl. No. 12/636,616.

U.S. Office Action mailed Jan. 26, 2010 from U.S. Appl. No. 11/951,236.

U.S. Notice of Allowance mailed Mar. 2, 2010 from U.S. Appl. No. 11/349,035.

Allowed Claims from U.S. Appl. No. 11/349,035, allowed Mar. 2010.

Danek, et al, "Tungsten Barrier and Seed for Copper Filled TSV," Novellus Systems, Inc., filed Mar. 12, 2010, U.S. Appl. No. 12/723,532.

Chandrashekar, et al., "Method for Forming Tungsten Contacts and Interconnects with Small Critical Dimensions," Novellus Systems, Inc, filed Apr. 6, 2010, U.S. Appl. No. 12/755,248.

Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.

U.S. Notice of Allowance and Allowed Claims mailed Apr. 6, 2010 from U.S. Appl. No. 11/951,236.

U.S. Office Action mailed May 3, 2010 from U.S. Appl. No. 12/407,541.

U.S. Final Office Action mailed May 7, 2010 from U.S. Appl. No. 12/202,126.

Chan et al., "Method for Improving Uniformity and Adhesion of Low Resistivity Tungsten Film," Novellus Systems, Inc., U.S. Appl. No. 12/829,119, filed Jul. 1, 2010.

U.S. Office Action mailed Jun. 11, 2010 from U.S. Appl. No. 11/963,698.

U.S. Final Office Action mailed Jul. 23, 2010 from U.S. Appl. No. 12/030,645.

U.S. Office Action mailed Jul. 26, 2010 from U.S. Appl. No. 12/202,126.

International Search Report and Written Opinion mailed Apr. 12, 2010 from Application No. PCT/US2009/055349.

Hoover, Cynthia, "Enabling Materials for Contact Metallization," Praxair Electronic Materials R&D, Jul. 2007, pp. 1-16.

Purchase of ethylcyclopentadienyl)dicarbonylnitrosyltungsten from Praxair in Oct. 2006.

U.S. Final Office Action mailed Oct. 19, 2010 from U.S. Appl. No. 12/407,541.

U.S. Office Action for U.S. Appl. No. 12/538,770 mailed Nov. 23, 2010.

U.S. Final Office Action for U.S. Appl. No. 11/963,698 mailed Dec. 30, 2010.

U.S. Office Action for U.S. Appl. No. 12/636,616 mailed Jan. 25, 2011.

U.S. Final Office Action mailed Feb. 7, 2011 from U.S. Appl. No. 12/202,126.

Notice of Allowance and Fee Due mailed Jan. 24, 2011, from U.S. Appl. No. 12/030,645.

Allowed Claims from U.S. Appl. No. 12/030,645 as of Jan. 24, 2011.

Chan et al., "Methods for Growing Low-Resistivity Tungsten for High Aspect Ratio and Small Features," Novellus Systems, Inc., U.S. Appl. No. 13/095,734, filed Apr. 27, 2011.

U.S. Office Action for U.S. Appl. No. 12/407,541 mailed May 2, 2011.

U.S. Office Action for U.S. Appl. No. 12/755,248 mailed May 13, 2011.

U.S. Office Action for U.S. Appl. No. 12/556,490 mailed Jun. 14, 2011.

U.S. Final Office Action for U.S. Appl. No. 12/636,616 mailed Jun. 15, 2011.

Notice of Allowance for U.S. Appl. No. 12/538,770 mailed Jun. 30, 2011.

Allowed Claims as of Jun. 30, 2011, for U.S. Appl. No. 12/538,770.
U.S. Office Action for U.S. Appl. No. 12/829,119, mailed Jun. 30, 2011.
U.S. Final Office Action mailed Apr. 28, 2009, from U.S. Appl. No. 11/782,570.
U.S. Office Action mailed Apr. 3, 2009, from U.S. Appl. No. 11/305,368.
U.S. Final Office Action mailed Feb. 26, 2009, from U.S. Appl. No. 11/265,531.
U.S. Notice of Allowance mailed May 4, 2009 from U.S. Appl. No. 11/265,531.
Allowed Claims from U.S. Appl. No. 11/265,531, allowed May 4, 2009.
U.S. Final Office Action mail Feb. 25, 2009, from U.S. Appl. No. 11/349,035.
U.S. Office Action mailed Jun. 11, 2009, from U.S. Appl. No. 11/963,698.
U.S. Office Action mailed Jun. 4, 2009, from U.S. Appl. No. 11/349,035.
Ken K. Lai and II. Henry Lamb, Precursors for Organometallic Chemical Vapor Deposition of Tungsten Carbide Films, 1995, Chemistry Material, pp. 2284-2292.
U.S. Office Action mailed Jun. 24, 2009 from U.S. Appl. No. 12/030,645.
U.S. Office Action mailed Aug. 5, 2009, from U.S. Appl. No. 11/951,236.
Chandrashekar et al., "Method for Depositing Thin Tungsten Film With Low Resistivity and Robust Micro-Adhesion Characteristics," Novellus Systems, Inc., U.S. Appl. No. 12/407,541, filed Mar. 19, 2009.
U.S. Office Action mailed Oct. 21, 2009 from U.S. Appl. No. 12/202,126.
U.S. Notice of Allowance mailed Nov. 17, 2009 from U.S. Appl. No. 11/305,368.
Allowed Claims from U.S. Appl. No. 11/305,368, allowed Nov. 17, 2009.
U.S. Final Office Action mailed Nov. 20, 2009 from U.S. Appl. No. 11/349,035.
U.S. Final Office Action mailed Dec. 9, 2009 from U.S. Appl. No. 11/963,698.
U.S. Notice of Allowance mailed Sep. 17, 2009 from U.S. Appl. No. 11/782,570.
Lee et al., PCT Search Report, Completed Oct. 15, 2004, PCT/US2004/006940, Int'l filing date May 3, 2004.
Lee et al., Written Opinion, Completed Oct. 15, 2004, PCT/US2004/006940, Int'l filing date May 3, 2004.
George et al., "Surface Chemistry for atomic Layer Growth", J. Phys. Chem, 1996, vol. 100, No. 31, pp. 13121-13131.
Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.
Klaus et al., "Atomic layer deposition of tungsten using sequential surface chemistry with a sacrificial stripping reaction", Thin Solid Films 360 (2000) 145-153.
Klaus et al., "Atomically Controlled Growth of Tungsten and Tungsten Nitride Using Sequential Surface Reactions," Applied Surface Science, 162-163, (2000) 479-491.
Li et al., "Deposition of $WN_xC_y$ Thin Films by ALCVD™ Method for Diffusion Barriers in Metallization," IITC Conference Report, 2002, 3 Pages.
Elam et al, "Nucleation and Growth During Tungsten Atomic Layer Deposition on $SiO_2$ Surfaces," Thin Solid Films, 2001, 13 Pages.
Collins et al., "Pulsed Deposition of Ultra Thin Tungsten for Plugfill of High Aspect Ratio Contacts," Presentation made at Semicon Korea 2003, Jan. 21, 2003, 9 pages.
Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.
Lee et al., Pulsed Deposition of Ultra Thin Tungsten and its Application for Plugfill of High Aspect Ratio Contacts, Abstract, Jan. 21, 2003, 1 page.
U.S. Office Action mailed Jul. 12, 2005, from U.S. Appl. No. 10/815,560.

U.S. Office Action mailed Jul. 17, 2002, from U.S. Appl. No. 09/975,074.
U.S. Office Action mailed Feb. 8, 2005, from U.S. Appl. No. 10/649,351.
U.S. Office Action mailed Jul. 14, 2005, from U.S. Appl. No. 10/649,351.
Presentation by Inventor James Fair: "Chemical Vapor Deposition of Refractory Metal Silicides," 27 Pages, 1983.
Saito et al., "A Novel Copper Interconnection Technology Using Self Aligned Metal Capping Method," IEEE, 3 Pages, 2001.
U.S. Office Action mailed Jun. 22, 2004, from U.S. Appl. No. 10/435,010.
U.S. Office Action mailed Mar. 23, 2005, from U.S. Appl. No. 10/690,492.
U.S. Office Action mailed Nov. 23, 2005, from U.S. Appl. No. 10/984,126.
Chan et al., "Methods for Growing Low-Resistivity Tungsten Film", Novellus Systems, Inc., filed Nov. 1, 2005, U.S. Appl. No. 11/265,531, pp. 1-35.
Levy et al., "Deposition of Tungsten Nitride", Novellus Systems, Inc., filed Dec. 16, 2005, U.S. Appl. No. 11/305,368, pp. 1-39.
U.S. Office Action mailed Dec. 28, 2005, from U.S. Appl. No. 10/815,560.
U.S. Office Action mailed Dec. 30, 2005, from U.S. Appl. No. 10/649,351.
Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.
U.S. Office Action mailed Apr. 17, 2006, from U.S. Appl. No. 10/815,560.
U.S. Office Action mailed May 17, 2006, from U.S. Appl. No. 10/984,126.
U.S. Office Action mailed Sep. 28, 2006, from U.S. Appl. No. 10/815,560.
Gao et al., "Methods for Improving Uniformity and Resistivity of Thin Tungsten Films," Novellus Systems, Inc, filed Jul. 24, 2007, U.S. Appl. No. 11/782,570, pp. 1-23.
Chan et al., "Methods for Growing Low-Resistivity Tungsten for High Aspect Ratio and Small Features," Novellus Systems, Inc., U.S. Appl. No. 12/030,645, filed Feb. 13, 2008.
Humayun et al., "Methods for Forming All Tungsten Contacts and Lines," Novellus Systems, Inc., U.S. Appl. No. 11/963,698, filed Dec. 21, 2007.
Chan et al., "Method for Improving Uniformity and Adhesion of Low Resistivity Tungsten Film," Novellus Systems, Inc., U.S. Appl. No. 11/951,236, filed Dec. 5, 2007.
Notice of Allowance and Fee Due mailed Mar. 12, 2003, from U.S. Appl. No. 09/975,074.
Allowed Claims from U.S. Appl. No. 09/975,074, allowed Mar. 12, 2003.
Notice of Allowance and Fee Due mailed Jul. 21, 2006, from U.S. Appl. No. 10/649,351.
Allowed Claims from U.S Appl. No. 10/649,351, allowed Jul. 21, 2006.
Notice of Allowance and Fee Due mailed Oct. 7, 2004, from U.S. Appl. No. 10/435,010.
Allowed Claims from U.S. Appl. No. 10/435,010, allowed Oct. 7, 2004.
Notice of Allowance and Fee Due mailed Aug. 25, 2006, from U.S. Appl. No. 10/984,126.
Notice of Allowance and Fee Due mailed Sep. 14, 2005, from U.S. Appl. No. 10/690,492.
Allowed Claims from U.S. Appl. No. 10/690,492, allowed Sep. 14, 2005.
Notice of Allowance and Fee Due mailed Apr. 24, 2007, from U.S. Appl. No. 10/815,560.
Allowed Claims from U.S. Appl. No. 10/815,560, allowed Apr. 24, 2007.
U.S. Office Action mailed Jun. 27, 2008, from U.S. Appl. No. 11/305,368.
U.S. Office Action mailed Aug. 21, 2008, from U.S. Appl. No. 11/265,531.

Ashtiani et al., "Ternary Tungsten-Containing Thin Film Heater Elements," Novellus Systems, Inc., U.S. Appl. No. 61/025,237, filed Jan. 31, 2008.

Chen et al., "Method for Reducing Tungsten Roughness and Improving Reflectivity," Novellus Systems, Inc., U.S. Appl. No. 12/202,126, filed Aug. 29, 2008.

U.S. Office Action mailed Oct. 16, 2008, from U.S. Appl. No. 11/349,035.

U.S. Office Action mailed Sep. 29, 2008, from U.S. Appl. No. 11/782,570.

Chandrashekar et al., "Method for depositing thin tungsten film with low resistivity and robust micro-adhesion characteristics," Novellus Systems, Inc., U.S. Appl. No. 61/061,078, filed Jun. 12, 2008.

* cited by examiner

TERNARY TUNGSTEN-CONTAINING RESISTIVE THIN FILMS

CROSS REFERENCE TO RELATED APPLICATION

This application claims priority to U.S. Provisional Patent Application No. 61/025,237 filed Jan. 31, 2008, titled TERNARY TUNGSTEN-CONTAINING THIN FILM HEATER ELEMENTS.

BACKGROUND

Highly resistive thin films are used as heater elements for various applications. One key application is phase change memory, in which the different electrical resistivity values of the crystalline and amorphous states of chalcogenide glass are used to store data. The amorphous, high resistance state is typically used to represent a binary 0, with the crystalline, low resistance state representing a 1. A heater element is needed to switch a chalcogenide glass memory element from the crystalline phase to the amorphous phase. Thin film resistive heaters are also used in inkjet printers, micro-reactors and other devices.

SUMMARY OF INVENTION

Heater elements made of high resistivity ternary and quaternary thin films containing three or more of W, C, O, N and Si are provided. The thin films have resistivities at least about 1000 $\mu\Omega$-cm at 50 to 60 Angstroms. The ternary and quaternary films have improved stability over binary films on anneal. Methods of depositing the thin films are also provided. The methods involve depositing the film from an organometallic tungsten precursor under conditions such that a highly resistive, yet electrically conductive continuous thin film is formed.

One aspect of the invention relates to methods of depositing a thin film resistive heater element. In certain embodiments, the methods involve providing a substrate having an exposed conductive region to a deposition chamber; exposing the exposed conductive region to a tungsten-containing organometallic precursor and a reducing agent to thereby deposit a ternary or higher order tungsten-containing film on the conductive region, wherein the film comprises at least two of: carbon, nitrogen, oxygen and silicon, each in an amount of at least 5 atomic percent and wherein the resistivity of the thin film is between about 1000-10000 $\mu\Omega$-cm at 50 angstroms.

The methods may also involve performing a multiple thin film deposition cycles, each cycle including exposing the tungsten electrode (or other conductive region) to an organometallic precursor and an optional co-reactant to form a saturated layer of the precursor and the co-reactant and/or a product thereof on at least the exposed electrode; and exposing the saturated layer to a hydrogen plasma to form a portion of thin film heater element, said portion comprising tungsten and at least two of carbon, nitrogen, oxygen and silicon. The cycles may be repeated to deposit a tungsten-containing ternary or higher order thin film comprising tungsten and at least two of carbon, nitrogen, oxygen and silicon, said thin film having a resistivity of at least 4000 $\mu\Omega$-cm at 50 angstroms.

Another aspect of the invention relates to thin film heater elements. In certain embodiments, the thin film heater element is made of tungsten and at least two of carbon, nitrogen, oxygen and silicon, each in an amount of at least 5 atomic percent, and having a resistivity of between about 1000-10000 $\mu\Omega$-cm at 50 angstroms, or in certain embodiments about 2000-10000 $\mu\Omega$-cm at 50 angstroms.

BRIEF DESCRIPTION OF THE DRAWINGS

The following detailed description can be more fully understood when considered in conjunction with the drawings in which.

DETAILED DESCRIPTION

Introduction

In the following description, numerous specific details are set forth in order to provide a thorough understanding of the invention, which pertains to forming tungsten-containing thin film heater elements. Modifications, adaptations or variations of specific methods and of structures shown herein will be apparent to those skilled in the art and are within the scope of this invention.

Thin film resistive heater elements are used in various applications, including ink-jet printers, micro-reactors, and other micro-instruments. One key application employing thin film resistive heater elements is phase change memory. Described herein are ternary, quaternary and higher order tungsten-containing thin film heater elements. The films are deposited from an organometallic tungsten precursor. They have high resistivity, with the resistivity stable on anneal to 900 C. Although the thin film heater elements are described with particular application to phase change memory cells, the heater elements and methods of forming them may also be used in other applications.

Figure 1:
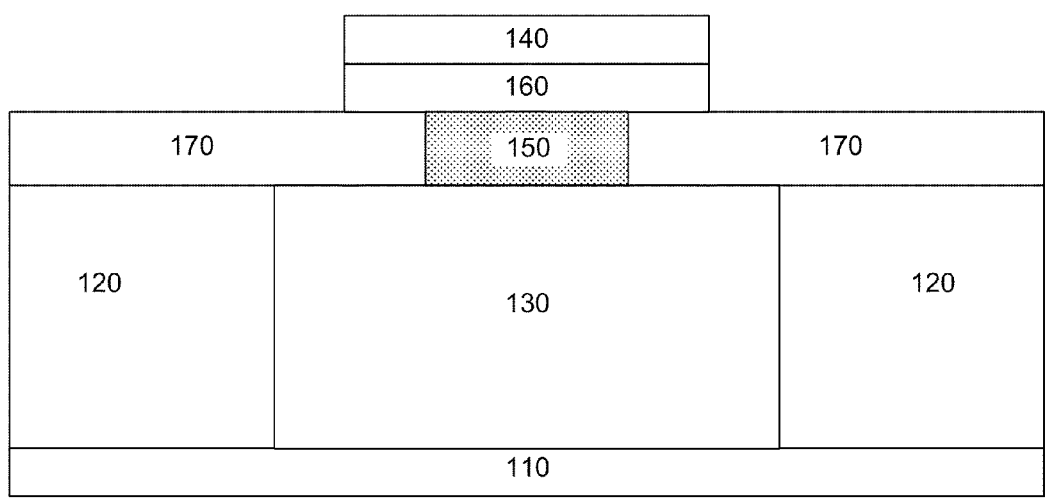
FIG. 1 illustrates a cross-sectional view of one embodiment of a phase change memory cell with a resistive heating element.

FIG. 1 shows a cross-sectional view of a phase change memory cell. The cell includes a conductive layer 110, a lower electrode 130, a phase change material 160, a second electrode 140, and a heater element 150. Lower electrode 130 is in a first dielectric layer 120, and heater element 150 is in a second dielectric layer 170. The cell may be formed on a semiconductor substrate.

Phase change material 160 is typically a chalcogenide glass material, though other materials that are capable of changing from a crystalline to an amorphous state or vice versa upon application or withdrawal of heat may also be used. Because the electrical resistivity of the amorphous state of the chalcogenide material is significantly higher than the crystalline state, the phase change material can be used to store data. The amorphous, highly resistive state is used to represent one bit value (0 or 1) with the crystalline, low resistive state used to represent the other bit value.

Conductive layer 110 may be an address line, e.g., a column line, row line, bit line or word line, used to program or read information stored using the phase change material. The conductive layer may be connected to external addressing circuitry.

The electrodes are made of electrically conductive materials. In the example shown in FIG. 1, the lower electrode 130 is a plug, e.g., a tungsten plug. The first dielectric layer 120 may be silicon oxide, silicon nitride or any other type of electrically insulating material. Second dielectric material 170 is electrically and thermally insulating may be made of the same or different material as dielectric layer 120.

Heater element 150 is a material that generates heat in response to the electrical current passing through the adjacent electrode, lower electrode 130. The resistivity of heater element 150 is high relative to that of electrode 130 to generate heat from the current. In operation a current or voltage pulse is applied to the heater element to generate heat. The heat generated by the heater element heats the phase-change material to a temperature above its crystallization temperature and below its melting temperature to achieve a crystalline state, which typically represents a bit value of 1. To change the phase change material back to its amorphous state, the heater element heats the material above its melting point. The phase change material is then quenched to achieve an amorphous state, which typically represents a bit value of 0.

Binary films such as WN (tungsten nitride), TiN (titanium nitride) and tantalum nitride are examples of the materials currently used as thin film heater elements. Difficulties with these films for heater elements includes thermal stability on anneal and/or resistivity dependence on temperature. Tungsten nitride for example undergoes a phase transition at temperatures lower than 900 C. Another difficulty is depositing thin films having high resistivity and that are continuous and conducting.

Novel ternary and quaternary tungsten-containing thin film heater elements are provided herein. The thin films have high resisitivity (e.g., around 5000 μΩ-cm for a 50-60 angstrom film). The films are stable on anneal to 900° C. and have electric contact to the underlying surface (e.g., the tungsten plug electrode in FIG. 1). The ternary and quaternary films have better thermal stability on anneal as compared to binary films. The dependence of resistivity on temperature for the ternary and quaternary films is lower than for binary films such as TiN and WN. Also provided are methods of depositing the ternary and quaternary films. The films are deposited from organometallic tungsten precursors, which have been found to produce thin continuous and conducting films.

Figure 2A:
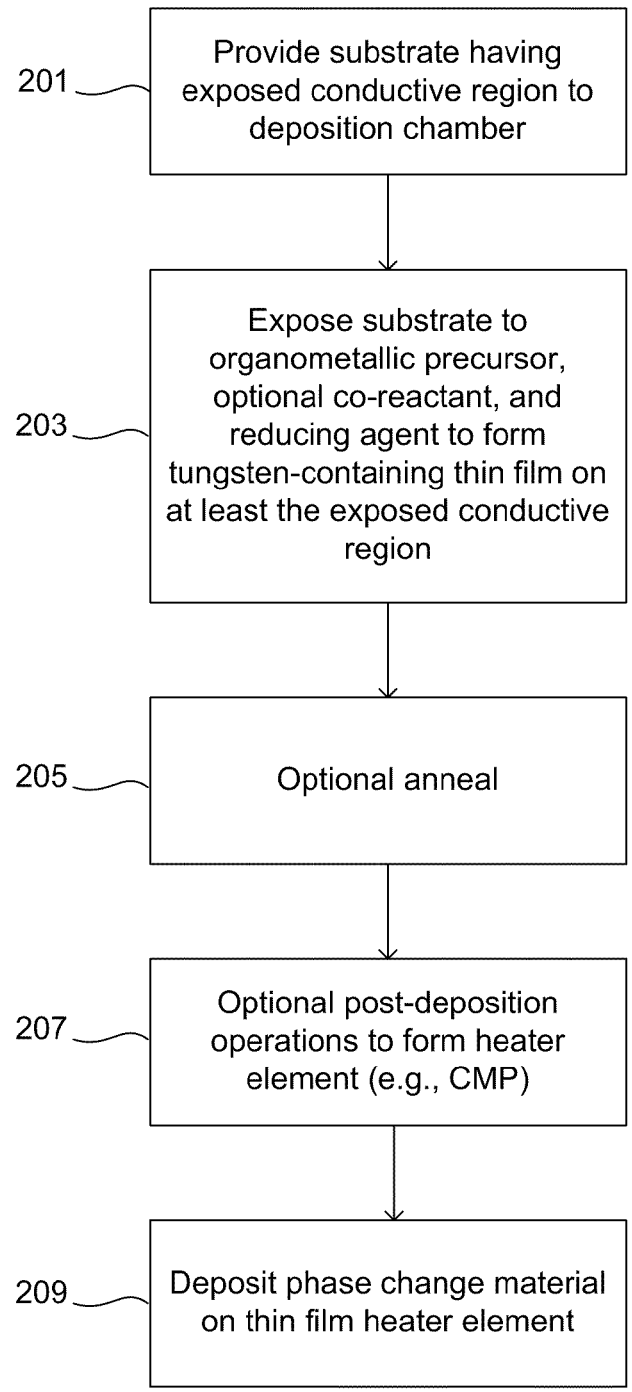
FIGS. 2A and B are process flow sheets illustrating operations in methods of depositing a ternary or higher order thin film resistive heating element according to certain embodiments.
Figure 3A:
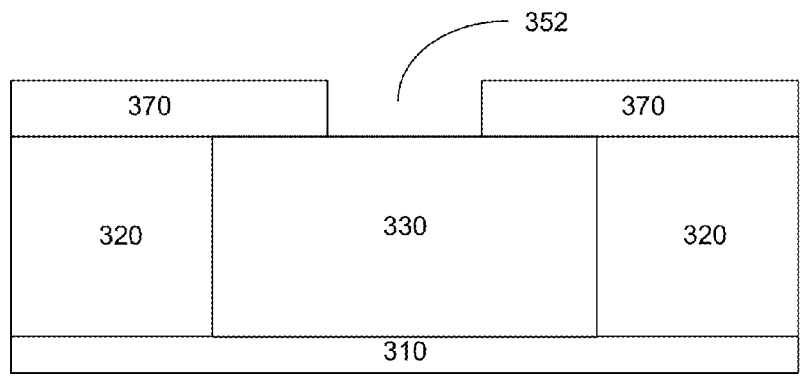
FIGS. 3A-C illustrate cross-sectional views of a partially fabricated phase change memory cell during various stages of thin film heater element formation according to certain embodiments.

FIG. 2A is a process flow sheet illustrating operations in a method of depositing a thin film heater element according to certain embodiments. First in an operation 201, a substrate on which the thin film is to be deposited is provided to a deposition chamber. The thin film is generally deposited on a conductive region (e.g., an electrode or a conductive contact to an electrode). The substrate may take various forms. For example, in applications in which the phase change memory is embedded within a complementary metal oxide silicon (CMOS) device, the substrate may be a semiconductor substrate having various films or layers of a partially fabricated integrated circuit. FIG. 3A shows on example of a substrate that may be supplied to the deposition chamber. Conductive layer 310 is on a semiconductor substrate (not shown). Electrode 330 is a tungsten plug, which provides a conductive path from conductive layer 310, and is surrounded by dielectric material 320. Second dielectric layer 370 has been deposited over first dielectric layer 320 and electrode 330, with a hole 352 exposing at least part of electrode 330. Note that the structure shown in FIG. 3A is one example of a structure on which the thin film heater elements described herein may be deposited. The thin film heater elements may be deposited on any desired substrate including partially fabricated microelectro-mechanical system substrates. In many embodiments, the substrate provided to the deposition has at least an exposed electrode surface, as in FIG. 3A. Providing a substrate to a deposition chamber may involve placing the substrate on a pedestal, chuck or other substrate holder in the deposition chamber, e.g., using a robot or other wafer handling apparatus. In certain embodiments, the substrate may undergo various processing operations in the deposition chamber prior to the thin film deposition, including deposition of other layers, in which case providing the substrate to the chamber may involve keeping it there after a previous process.

Returning to FIG. 2A, the substrate is then exposed to an organometallic precursor and a reducing agent in an operation 203. In certain embodiments, the organometallic precursor is a non-halogen containing organometallic tungsten precursor, with examples including tungsten hexacarbonyl, dicyclopentadienyl dihydrido tungsten, ethylcyclopentadienyl tricarbonylhydrido tungsten, ethylcyclopentadienyl dicarbonyl nitrosyl tungsten. As indicated above, after being reduced, the organometallic tungsten precursor forms a film containing at least two of: W, C, O, N and Si. The C, O, N, or Si components of the film may be introduced into the film from the organometallic precursor or from a coreactant, e.g., a nitrogen-containing co-reactant such as $NH_3$, an oxygen-containing co-reactant such as $O_2$, and a hydrocarbon co-reactant such as $C_2H_6$. The reducing agent may be any suitable reducing agent, including hydrogen, a silane, ammonia, a hydrocarbon, etc. The reducing agent may be activated (e.g., atomic hydrogen) or non-activated. In certain embodiments, the carbon, nitrogen and silicon components of the ternary or quaternary film may be in whole or in part introduced by the reducing agent (e.g., using ammonia as a reducing/nitriding agent).

Figure 3B:
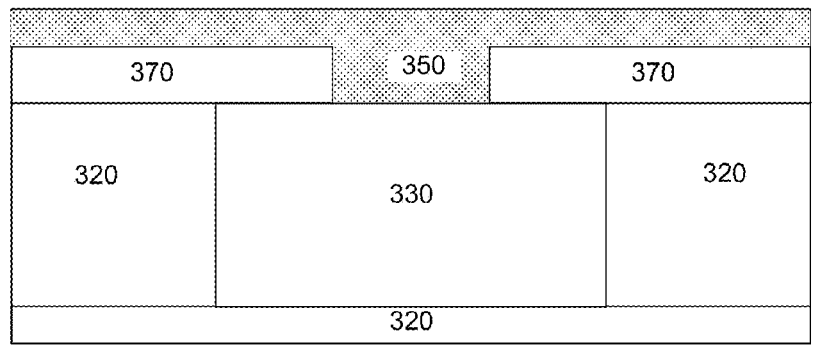

Deposition of the ternary or quaternary film in operation 203 may be performed by a chemical vapor deposition (CVD), plasma-enhanced chemical vapor deposition (PECVD), atomic layer deposition (ALD), pulsed nucleation layer (PNL), plasma-enhance atomic layer deposition, or ion-induced atomic layer deposition (iALD) process. Deposition continues until the desired film thickness is deposited—for phase change memory cell applications about 50-100 angstroms is generally desired for the thin film heater element. FIG. 3B shows the substrate of FIG. 3A after deposition of the ternary or quaternary film 350.

Figure 3C:
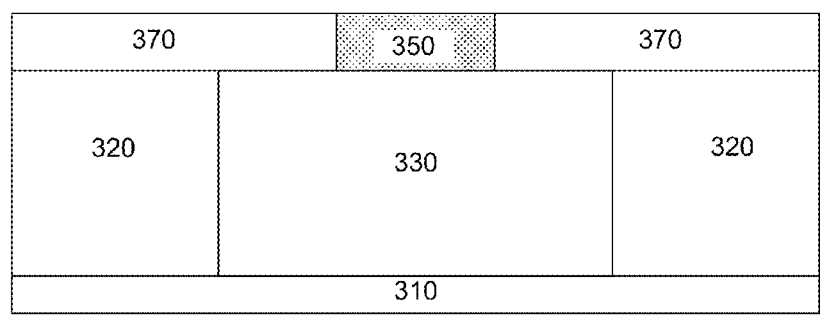

After the deposition process, an optional anneal process may be performed See 205 in FIG. 2A. Because the deposited film is a ternary or higher order film, it is unlikely to undergo any phase transitions during the anneal process. This is unlike binary films such as tungsten nitride or titanium nitride, which undergo phase transitions at temperatures as low as 600C. Any post-deposition operations required to form the heater element are then performed in an operation 207, such a chemical-mechanical planarization. FIG. 3C shows the example of FIG. 3B, in which excess material 350 on the dielectric layer surface is removed. The phase change material may then be deposited or formed on the heater element by any appropriate method. See 209. Although not indicated in the figure, a nitride liner may be deposited on the heater element prior to deposition of the phase change material.

Figure 2B:
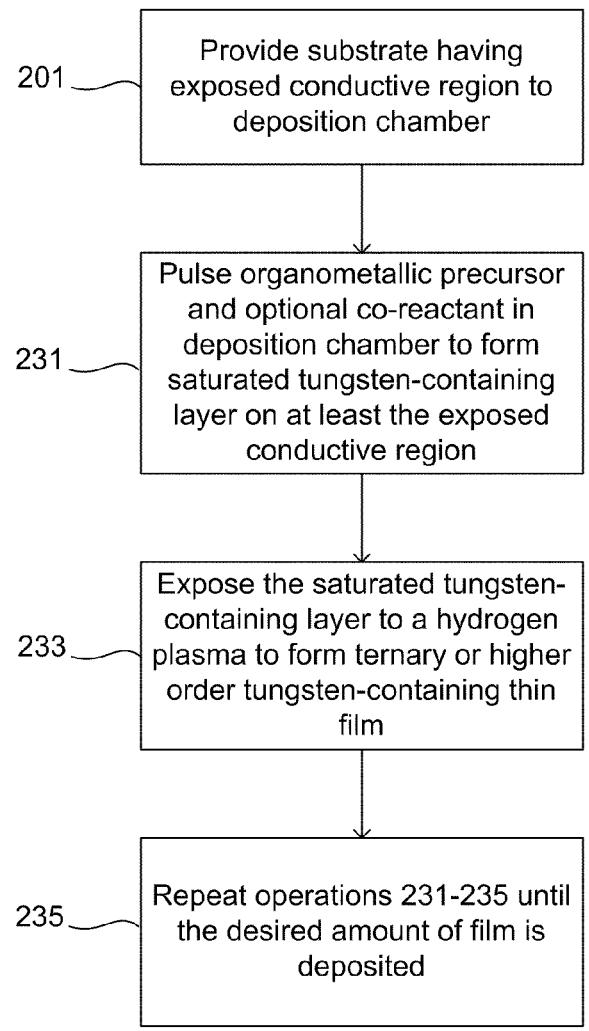

FIG. 2B shows an example of depositing the ternary or higher order heater element thin film according to a certain embodiment of the method described above. In this embodiment, the film is deposited by alternating cycles of organometallic precursor doses and hydrogen plasma exposure. As with the process shown in FIG. 2A, the process begins by providing the substrate on which the heater element is to be deposited to a deposition chamber (201). In an operation 231, the organometallic precursor is pulsed to form a saturated film on the substrate surface. Although not shown, an optional co-reactant may also be pulsed, either with the organometallic precursor. At this point, the saturated film typically contains tungsten, and at least two of carbon, oxygen, nitrogen and silicon. Although not shown, the chamber may be purged or evacuated at this point. The substrate is then exposed to a hydrogen plasma in an operation 233. The hydrogen plasma reduces the saturated layer, forming the ternary or quaternary film. As discussed further below, the hydrogen plasma controls the composition and resistivity of the deposited film; longer exposure time has been shown to result in more carbide incorporation in the film and a reduction in oxygen and nitrogen. Resistivity is also affected by the exposure time. By tuning the exposure time the resistivity of the deposited film is controlled. Operations 231 and 233 are then repeated as many times as necessary to deposit the desired film thickness. See 235. The process shown in FIG. 2B may be extended to other reducing agents, e.g., ammonia, that may be provided in a plasma.

Figure 4A:
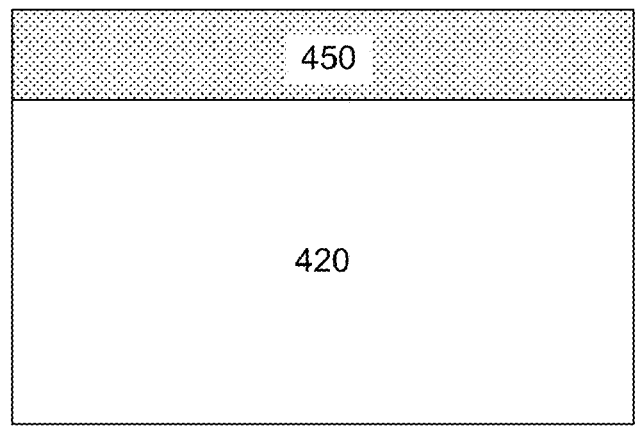
FIGS. 4A and 4B illustrate cross-sectional views various embodiments of a thin film heater element deposited on an electrode.
Figure 4B:
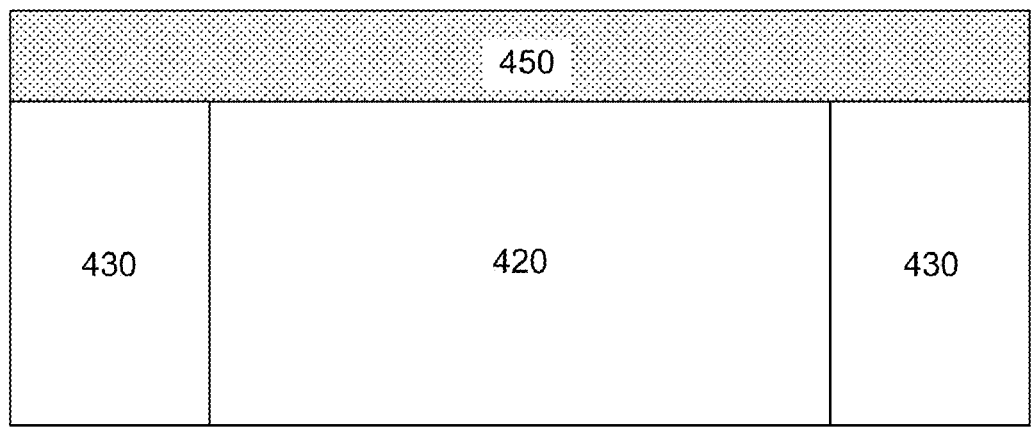
Figure 4C:
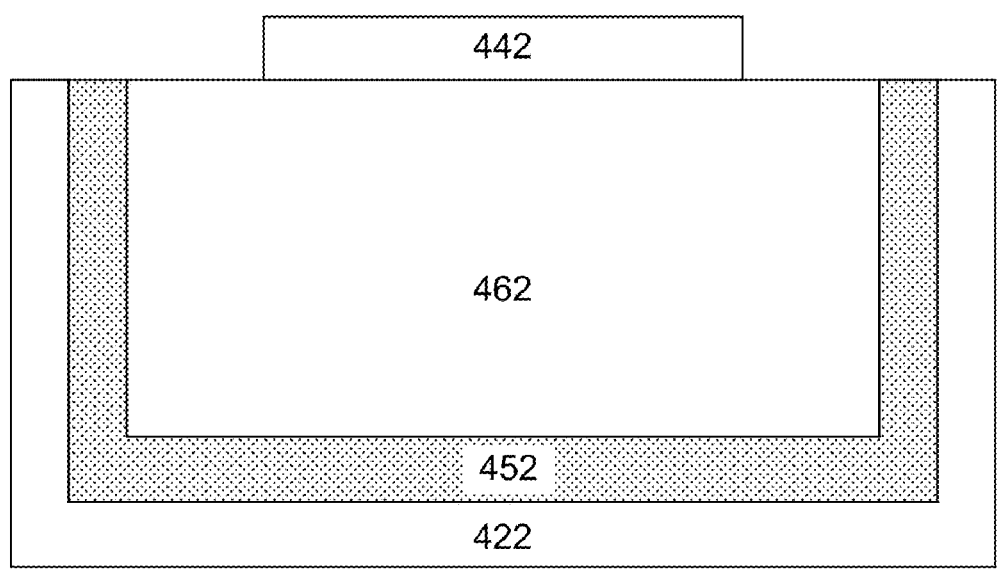
FIG. 4C illustrates a cross-sectional view of a phase change memory cell with a resistive heating element.

In the example process scheme depicted in FIGS. 3A-3C, the film is deposited in an inlaid hole in a dielectric layer. For small holes, highly conformal processes such as ALD processes may be preferred for deposition. The process scheme shown in FIGS. 3A-3C is just an example of one of a multitude of possible process sequences in forming a phase change memory cell. The processes described in FIGS. 3A and 3B are not limited to such a sequence. For example, formation of the thin film heater elements is not limited to conformal deposition in holes. Depending on the process scheme, the film may be deposited on a planar surface. FIG. 4A shows an example of a thin film heater element 450 deposited on an electrode 420 and FIG. 4B shows an example of a thin film heater element deposited on an electrode 420 and dielectric material 430. Subsequent process operations, e.g., forming a mask and removing regions of the deposited thin film may be used to form the heater element. It should also be noted that the phase change memory cell shown in FIG. 1 is just an example of such a structure. FIG. 4C shows another example, with lower electrode 422, heater element 452, phase change material 462, and upper electrode 442. Heater element 452 contacts lower electrode 422 and phase change material 462. In this case, the ternary or quaternary tungsten thin film may be deposited conformally on the lower electrode. Regardless of the ultimate shape of the thin film or particular processing scheme used, the thin film may be deposited as described in FIG. 2A or 2B.

Organometallic Tungsten (OMW) Precursors

The thin film resistive heating elements are deposited from organometallic tungsten precursors. The organometallic tungsten (OMW) precursor is typically a halogen-free compound that may contain oxygen and nitrogen. According to various embodiments, OMW precursor may be aliphatic or aryl, including alkyl, alkenyl, alkynyl and phenyl groups. The OMW precursor may also have carbon and/or nitrogen in the form of carbonyl, nitrosyl and amino groups. Specific examples may include tungsten hexacarbonyl, dicyclopentadienyl dihydrido tungsten, ethylcyclopentadienyl tricarbonylhydrido tungsten, ethylcyclopentadienyl dicarbonyl nitrosyl tungsten.

In certain embodiments, the organometallic tungsten precursor may be introduced with a co-reactant, e.g., a carbon or nitrogen containing compound, to tune the composition of the deposited film.

Composition and Properties of Ternary or Quaternary Thin Film Heater Elements

Figure 5:
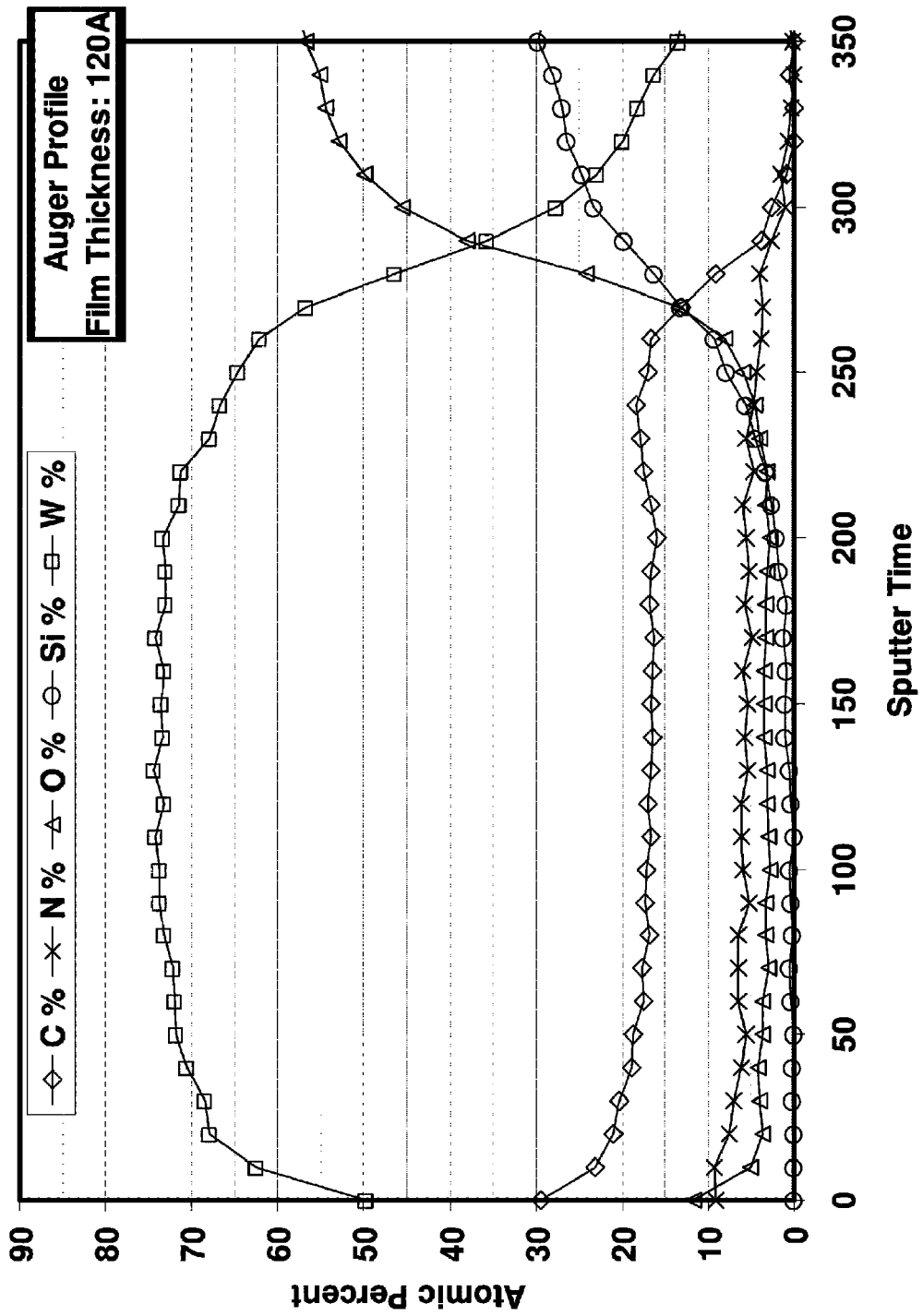
FIG. 5 is a graph showing the composition of an organometallic tungsten film according to an embodiment.

The deposited thin films contain tungsten and at least two of C, O, N, Si, Ge, S, P, B and Al. Other impurities may also be present. In general, in order for an element be considered one of the components of a ternary (three-component) or quaternary (four-component) film (as opposed to an impurity), the element is at least 2 (atomic) percent of the film. FIG. 5 shows a composition of a film deposited from the organometallic tungsten precursor ethylcyclopentadienyl dicarbonyl nitrosyl tungsten. In this example, the film contains about 70% tungsten, 17% carbon and 5% nitrogen. A small amount of oxygen is also present. (The silicon indicated is due to deposition on a silicon oxide substrate). Examples of ternary films are WCO, WCN, WCSi, WNSi, and WNO. Examples of quaternary and higher order films are WCNO, WCNOSi, WCNSi and WCOSi.

In certain embodiments, the as-deposited film composition may be tuned by using a hydrogen or other reducing agent plasma, for example, in an ALD process. It has been found that in an ALD process of alternating pulses of organometallic precursor and H plasma exposure, increasing the plasma dose time increased the amount of carbide, while decreasing the amount of nitrogen and oxygen in the final film. This indicates that the plasma results in converting carbon to carbide, and removing oxygen and nitrogen. In certain embodiments, a co-reactant may also be used in conjunction with the organometallic precursor to tune the film properties.

Figure 6:
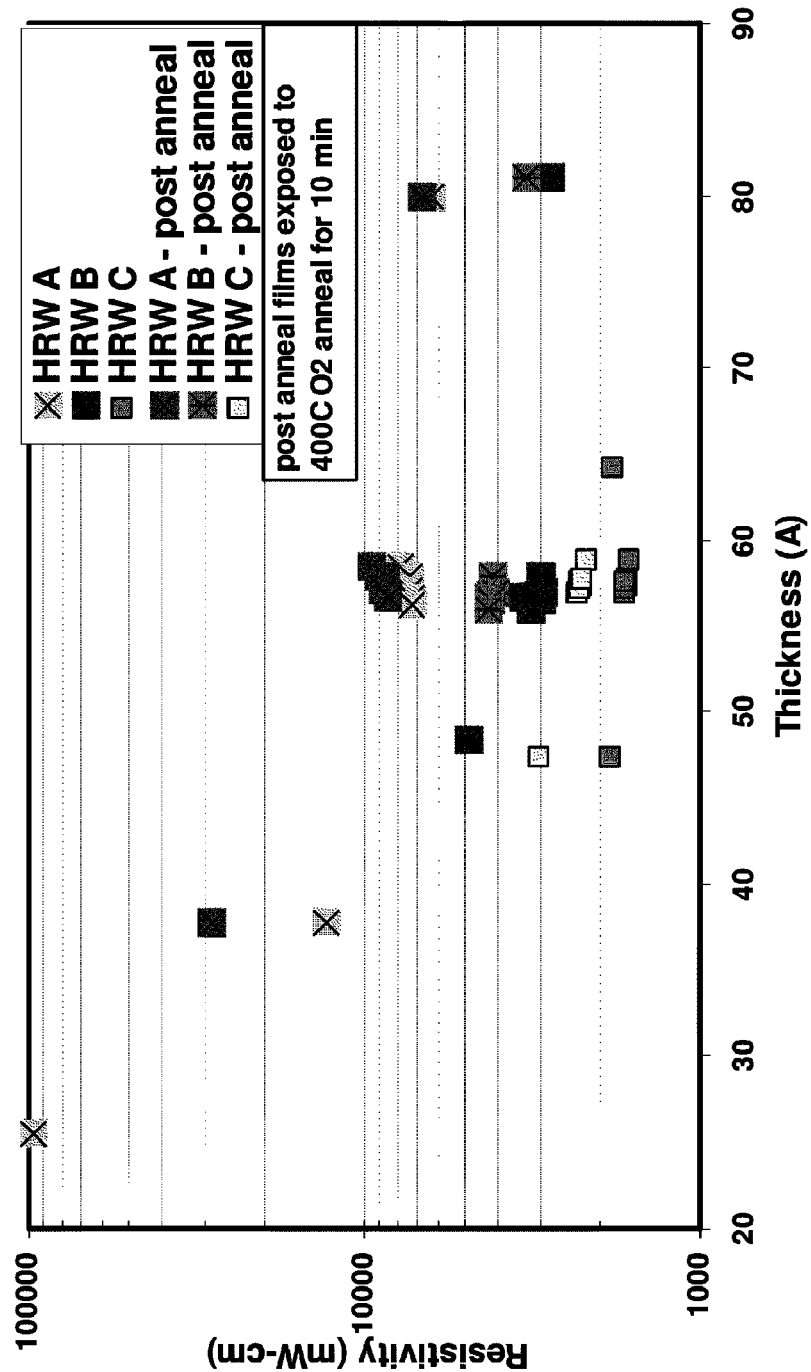
FIG. 6 is a graph showing resistivity as a function of thickness for various WCNO films formed according to certain embodiments.

Thin films for heater elements in phase change memory cells generally require resistivities greater than around 1000 $\mu\Omega$-cm at 50-60 angstroms, or 5000 $\mu\Omega$-cm at 50-60 angstroms in certain embodiments, though the required resistivity is dependent on the particular application. (Because resistivity depends on thickness, particularly at the small thicknesses of thin films, resistivity at a particular thickness is discussed as a film property, comparable across different films of different thicknesses). FIG. 6 shows resistivity for three high resistivity quaternary WCNO films, A, B and C, as a function of film thickness. Films A, B and C were deposited from ethylcyclopentadienyl dicarbonyl nitrosyl tungsten using alternate cycles of precursor does and H plasma exposure. Resistivity is shown both pre and post-anneal (400 C $O_2$ anneal for 10 minutes). As can be seen from the figure, the three sets of films (A, B and C) have different resistivity thickness curves. At about 50 angstroms, for example, the resistivity ranges from about 2000 $\mu\Omega$-cm to about 10000 $\mu\Omega$-cm. By controlling the plasma dose, the film resistivity can be controlled as desired within this range. Note that the resistivity is measurable at 15 angstroms (and other experiments show that sheet resistance of a film deposited from the same precursor is measurable as low as 10 angstroms), showing that the films are continuous at these very low thicknesses.

Experimental

Three sets of WCNO films were deposited from an ethylcyclopentadienyl dicarbonyl nitrosyl tungsten precursor, alternating pulses of the precursor with a hydrogen plasma. The films were deposited on a modified Altus 200 mm apparatus available from Novellus Systems. Resisitivity of various thicknesses of film was measured, both pre- and post-anneal. Results are presented in FIG. 6.

Apparatus

The methods of the invention may be carried out in various types of deposition apparatus available from various vendors. Examples of suitable apparatus include a Novellus Concept 2 Altus, a Concept-2 Altus-S, a Concept 3 Altus deposition systems, all available from Novellus Systems, Inc. of San Jose, Calif., or any of a variety of other commercially available CVD processing systems. In some cases, the process can be performed on multiple deposition stations sequentially. See, e.g., U.S. Pat. No. 6,143,082, which is incorporated herein by reference for all purposes. In some embodiments, the thin film deposition process is performed at a first station or at first and second stations that are one of two, four, five or even more deposition stations positioned within a single deposition chamber. The reducing gases and the organometallic precursor may be alternately introduced to the surface of the semiconductor substrate at the first station, using an individual gas supply system that creates a localized atmosphere at the substrate surface.

Figure 7:
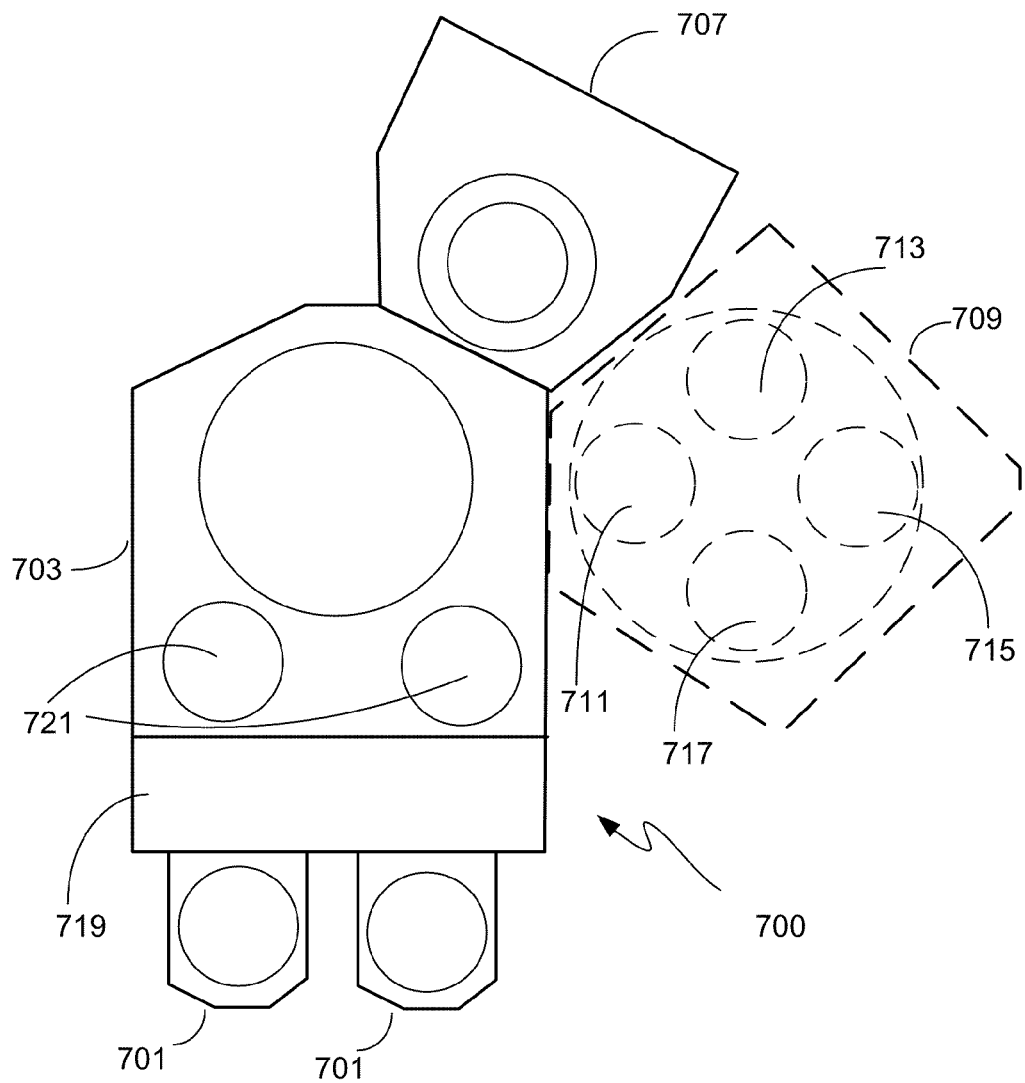
FIG. 7 is a schematic illustration showing an apparatus suitable for performing the methods described herein.

FIG. 7 is a block diagram of a processing system suitable for conducting tungsten thin film deposition processes in accordance with embodiments of the invention. The system 700 includes a transfer module 703. The transfer module 703 provides a clean, pressurized environment to minimize the risk of contamination of substrates being processed as they are moved between the various reactor modules. Mounted on the transfer module 703 is a multi-station reactor 709 capable of performing PNL deposition and CVD according to embodiments of the invention. Chamber 709 may include multiple stations 711, 713, 715, and 717 that may sequentially perform these operations. For example, chamber 709 could be configured such that station 711 performs PNL deposition, station 713 performs multi-pulse reducing agent treatment, and stations 715 and 717 perform CVD.

Also mounted on the transfer module 703 may be one or more single or multi-station modules 707 capable of performing plasma or chemical (non-plasma) pre-cleans. The module may also be used for various other treatments, e.g., post-deposition nitriding treatments. The system 700 also includes one or more (in this case two) wafer source modules 701 where wafers are stored before and after processing. An atmospheric robot (not shown) in the atmospheric transfer chamber 719 first removes wafers from the source modules 701 to loadlocks 721. A wafer transfer device (generally a robot arm unit) in the transfer module 703 moves the wafers from loadlocks 721 to and among the modules mounted on the transfer module 703.

In certain embodiments, a system controller is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the invention in a single or multi-chamber semiconductor processing tool.

The invention claimed is:

1. A method of depositing a thin film comprising: providing a substrate having an exposed conductive region to a deposition chamber; exposing the exposed conductive region to a tungsten-containing organometallic precursor and a reducing agent to thereby deposit a ternary or higher order tungsten-containing film on the conductive region, wherein the film comprises at least two of: carbon, nitrogen, oxygen silicon, germanium, sulfur, phosphorus, boron and aluminum, each in an amount of at least 1 atomic percent and wherein the resistivity of the thin film is between about 1000-10000 μΩ-cm at 50 angstroms.

2. The method of claim 1 wherein the film comprises at least two of carbon, nitrogen, oxygen silicon, germanium, sulfur, phosphorus, boron and aluminum, each in an amount of at least 5 atomic percent.

3. The method of claim 1 wherein the resistivity of the thin film is at least about 5000 μΩ-cm at 50 angstroms.

4. The method of claim 1 further comprising forming a phase change material adjacent to the thin film.

5. The method of claim 1 wherein exposing the conductive region to a tungsten-containing precursor and a reducing agent comprises multiple cycles of alternately exposing the conductive region to the organometallic tungsten precursor and a hydrogen plasma.

6. The method of claim 1 wherein the thickness of the deposited ternary or higher order tungsten-containing thin film is between about 50 and 100 angstroms.

7. The method of claim 1 wherein the conductive region is at least part of a tungsten electrode.

8. The method of claim 1 further comprising depositing a nitride liner on the ternary or higher order thin film.

9. The method of claim 1 wherein the tungsten-containing film is a WCNO film.

10. The method of claim 1 wherein the resistivity is between about 4000 and 6000 μΩ-cm at 50 angstroms.

11. The method of claim 1 further comprising annealing the ternary or higher order tungsten-containing film at a temperature of up to 900 C.

12. The method of claim 1, further comprising receiving an indication or determining that the resistivity of the film deposited from the organometallic precursor under a control set of operations is lower or higher than the desired resistivity; and increasing or decreasing hydrogen plasma exposure time based on that determination or indication.

* * * * *